US010170040B2

(12) United States Patent
Ogawa et al.

(10) Patent No.: US 10,170,040 B2
(45) Date of Patent: Jan. 1, 2019

(54) DISPLAY DEVICE

(71) Applicant: Japan Display Inc., Tokyo (JP)

(72) Inventors: Yasuhiro Ogawa, Tokyo (JP); Hiroshi Tabatake, Tokyo (JP); Hiroyuki Kimura, Tokyo (JP); Tetsuo Morita, Tokyo (JP); Makoto Shibusawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/709,661

(22) Filed: Sep. 20, 2017

(65) Prior Publication Data

US 2018/0090068 A1 Mar. 29, 2018

(30) Foreign Application Priority Data

Sep. 27, 2016 (JP) ................................. 2016-188126

(51) Int. Cl.
| | |
|---|---|
| *G09G 3/3233* | (2016.01) |
| *G02F 1/1343* | (2006.01) |
| *G09G 3/3258* | (2016.01) |
| *G09G 3/20* | (2006.01) |
| *G02F 1/1362* | (2006.01) |

(52) U.S. Cl.
CPC ......... *G09G 3/3233* (2013.01); *G02F 1/1343* (2013.01); *G02F 1/1362* (2013.01); *G09G 3/2003* (2013.01); *G09G 3/2074* (2013.01); *G09G 3/3258* (2013.01); *G09G 2300/0439* (2013.01)

(58) Field of Classification Search
None
See application file for complete search history.

(56) References Cited

U.S. PATENT DOCUMENTS

| | | | | |
|---|---|---|---|---|
| 8,502,216 | B2 * | 8/2013 | Akimoto | ........... H01L 29/66742 257/43 |
| 2005/0285197 | A1 * | 12/2005 | Park | ..................... H01L 29/4908 257/347 |
| 2010/0156877 | A1 * | 6/2010 | Kimura | ................. G09G 3/3241 345/211 |

(Continued)

FOREIGN PATENT DOCUMENTS

| | | |
|---|---|---|
| JP | 2012-141526 A | 7/2012 |
| JP | 2014-163991 A | 9/2014 |

*Primary Examiner* — Duane N Taylor, Jr.
(74) *Attorney, Agent, or Firm* — Typha IP LLC

(57) ABSTRACT

A display device includes a switching element having a first input/output terminal electrically connected to a first signal line, a first wiring electrically connected to a second input/output terminal of the switching element, a transistor having a gate electrode connected to the first wiring, a second wiring electrically connected to a source or drain of the transistor, a pixel electrode connected to the second wiring, a first insulating layer which is arranged between the first wiring and the second wiring and is arranged between the first wiring and the pixel electrode, a second insulating layer between the first insulating layer and pixel electrode, and a conducting layer between the first insulating layer and the second insulating layer, the conducting layer including a region overlapping the pixel electrode. The conducting layer includes a dividing groove dividing the conducting layer into a plurality of regions at a region overlapping the pixel electrode.

13 Claims, 14 Drawing Sheets

(56) References Cited

U.S. PATENT DOCUMENTS

| | | | |
|---|---|---|---|
| 2012/0175645 A1 | 7/2012 | Omoto | |
| 2013/0234136 A1* | 9/2013 | Arai | H01L 27/1225 |
| | | | 257/43 |
| 2015/0108470 A1* | 4/2015 | Yamazaki | H01L 29/42384 |
| | | | 257/43 |
| 2016/0005804 A1* | 1/2016 | Oh | H01L 51/0562 |
| | | | 257/72 |

* cited by examiner

DISPLAY DEVICE

CROSS REFERENCE TO RELATED APPLICATIONS

This application is based upon and claims the benefit of priority from the prior Japanese Patent Application No. 2016-188126, filed on Sep. 27, 2016, the entire contents of which are incorporated herein by reference.

FIELD

The present invention is related to a display device. One embodiment of the present invention disclosed in the specification is related to a pixel structure of a display device.

BACKGROUND

An organic electroluminescent element (hereinafter also referred to as "organic EL element"), which is known as a light emitting element, is arranged with a layer including an organic electroluminescent material between a pair of electrodes called an anode and a cathode. A display device in which an organic EL element is arranged in a pixel and light emitting is controlled by a transistor is being developed. A pixel of a display device in which an organic EL element is provided with the transistor and at least one capacitor element. Although a capacitor element is merely a structure in which an insulating layer is sandwiched between a pair of conducting layers, a structure for arranging a transistor together with a capacitor in a pixel is disclosed. For example, Japanese Unexamined Patent Application Publication No. 2012-141526 discloses a structure in which a capacitor element is formed using an anode electrode and a cathode electrode in a region which does not contribute to light emission. In addition, Japanese Unexamined Patent Application Publication No. 2014-163991 discloses a structure in which a conducting layer connected to a high potential power supply line or a low potential power supply line being arranged between wiring connected to a source or drain of a transistor and a pixel electrode, and a capacitor is formed between and this conducting layer and the pixel electrode.

As a pixel becomes higher in definition, wiring, a transistor and a capacitor arranged within the pixel are arranged more densely which generates parasitic capacitance between an electrode which forms a capacitor element and other conducting layers and becomes a problem. If an unintended parasitic capacitance is formed within a pixel, a voltage between a gate and source of a transistor driving an organic EL element fluctuates which causes a problem of deteriorating image quality.

SUMMARY

A display device related to one embodiment of the present invention includes a switching element having a first input/output terminal electrically connected to a first signal line, a first wiring electrically connected to a second input/output terminal of the switching element, a transistor having a gate electrode electrically connected to the first wiring, a second wiring electrically connected to a source or drain of the transistor, a pixel electrode electrically connected to the second wiring, a first insulating layer which is arranged between the first wiring and the second wiring and is arranged between the first wiring and the pixel electrode, a second insulating layer arranged between the first insulating layer and pixel electrode, and a conducting layer arranged between the first insulating layer and the second insulating layer, the conducting layer including a region overlapping the pixel electrode. The conducting layer includes a dividing groove dividing the conducting layer into a plurality of regions at a region overlapping the pixel electrode.

A display device related to one embodiment of the present invention includes a switching element having a first input/output terminal electrically connected to a first signal line, a first wiring electrically connected to a second input/output terminal of the switching element, a transistor having a gate electrode electrically connected to the first wiring, a second wiring electrically connected to a source or drain of the transistor, a pixel electrode electrically connected to the second wiring, a first insulating layer which is arranged between the first wiring and the second wiring and is arranged between the first wiring and the pixel electrode, a second insulating layer arranged between the first insulating layer and pixel electrode, and a conducting layer arranged between the first insulating layer and the second insulating layer, the conducting layer including a region overlapping the pixel electrode. The conducting layer includes an opening part in a region overlapping the first wiring.

DESCRIPTION OF EMBODIMENTS

Figure 1:
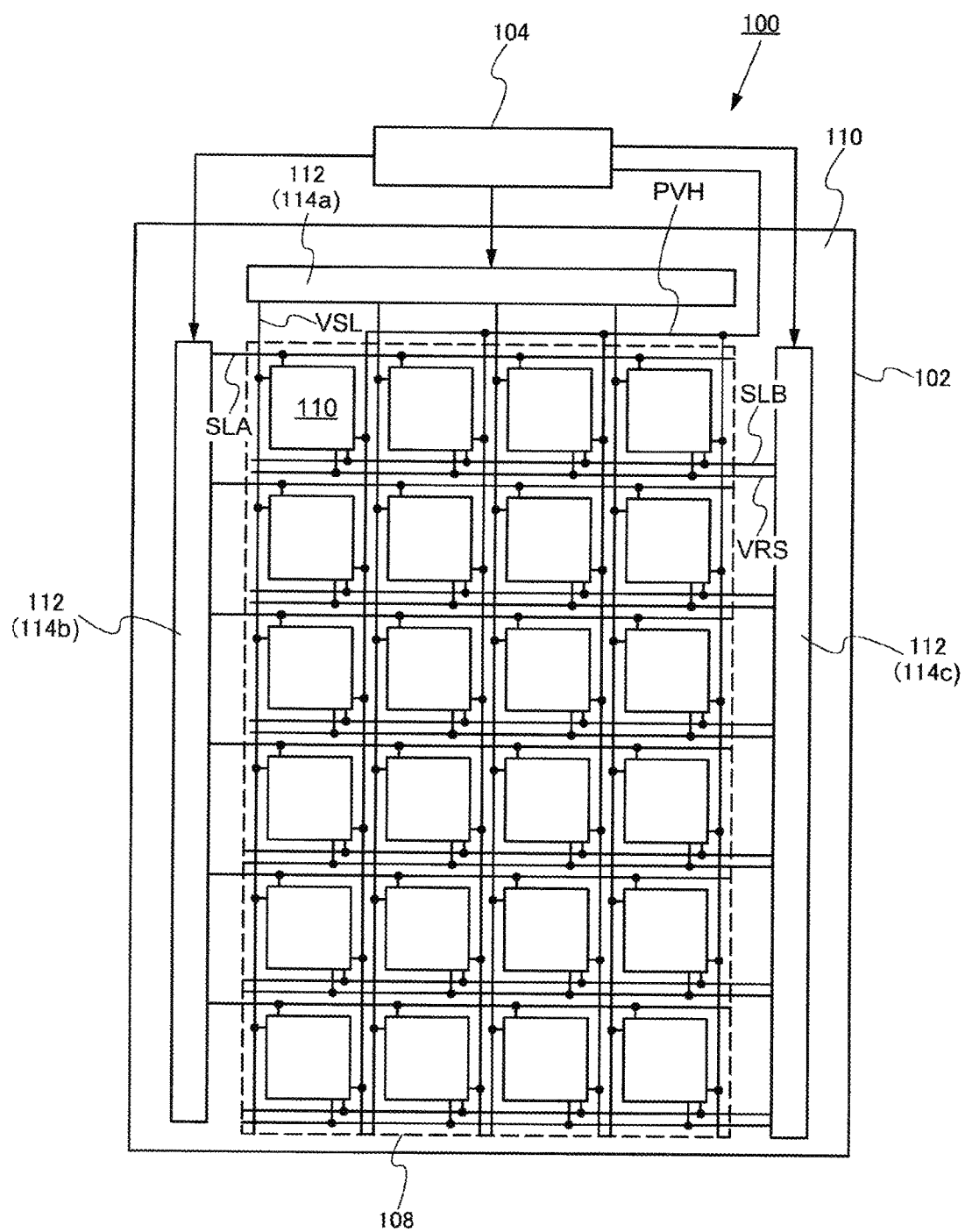
FIG. 1 is a diagram showing an outline view of a display device related to one embodiment of the present invention.

The embodiments of the present invention are explained below while referring to the diagrams. However, it is possible to perform the present invention using many different forms, and the present invention should not be limited to the content described in the embodiments exemplified herein. In addition, although the width, thickness and shape of each component are shown schematically compared to their actual form in order to better clarify explanation, the drawings are merely an example and should not limit an interpretation of the present invention. Furthermore, in the specification and each drawing, the same reference symbols (or symbols attached with a, b and the like after numbers) are attached to similar elements and elements that have been mentioned in previous drawings, and therefore a detailed explanation may be omitted where appropriate. Furthermore, characters denoted by "first", "second" with respect to each element are appropriate marks used to distinguish each element and unless otherwise explained do not include any further meaning.

In the present specification, in the case where a certain film is processed to form a plurality of films, the plurality of films may have different functions and roles. However, the plurality of films originates from a film formed as the same layer in the same process and have the same layer structure and same material. Therefore, the plurality of films are defined as existing in the same layer.

Furthermore, in the present specification, expressions such as "upper", "lower" and the like for explaining the drawing express a relative positional relationship between the structure of interest and another structure. In the present specification, in a side surface view, a direction from one main surface of a base described herein towards an organic EL element is defined as "upper", and a direction opposite thereto is defined as "lower". In the present specification and the scope of the patent claims, when expressing a mode for arranging another structure above a certain structure, in the case where it is simply described as "above", unless otherwise stated, it includes both a case where another structure is disposed directly above so as to contact that certain structure and another case where another structure is arranged above another structure with yet another structure arranged therebetween.

In addition, in the present specification, a "display device" indicates a device which displays an image using a light emitting element such as an organic EL element and the like. Therefore, a display module (also referred to as display panel) including a light emitting element such as an organic EL element and the like and a display device combining other elements (for example, cover glass and the like) with a display module are included in display devices.

First Embodiment

Figure 2:
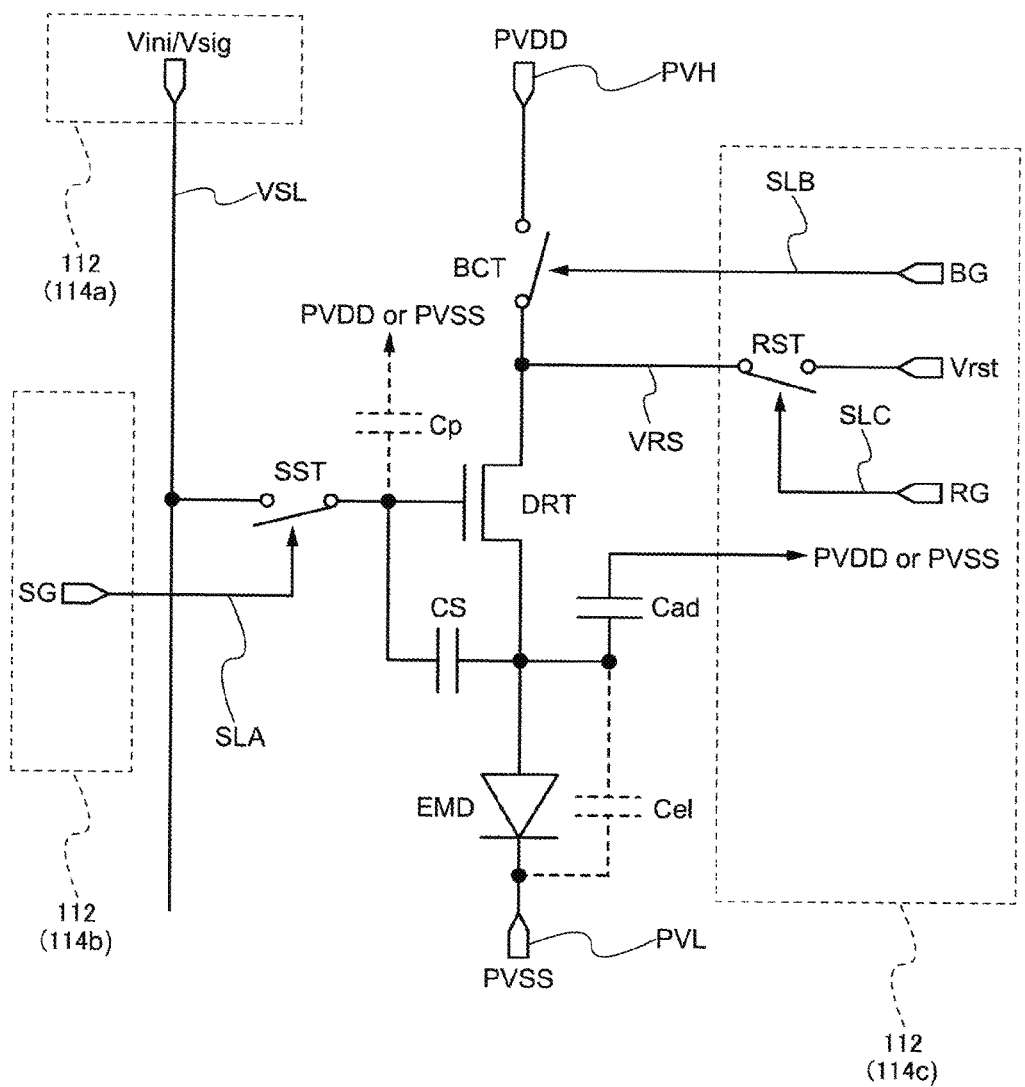
FIG. 2 is a diagram showing an equivalent circuit of a pixel in a display device related to one embodiment of the present invention.
Figure 3:
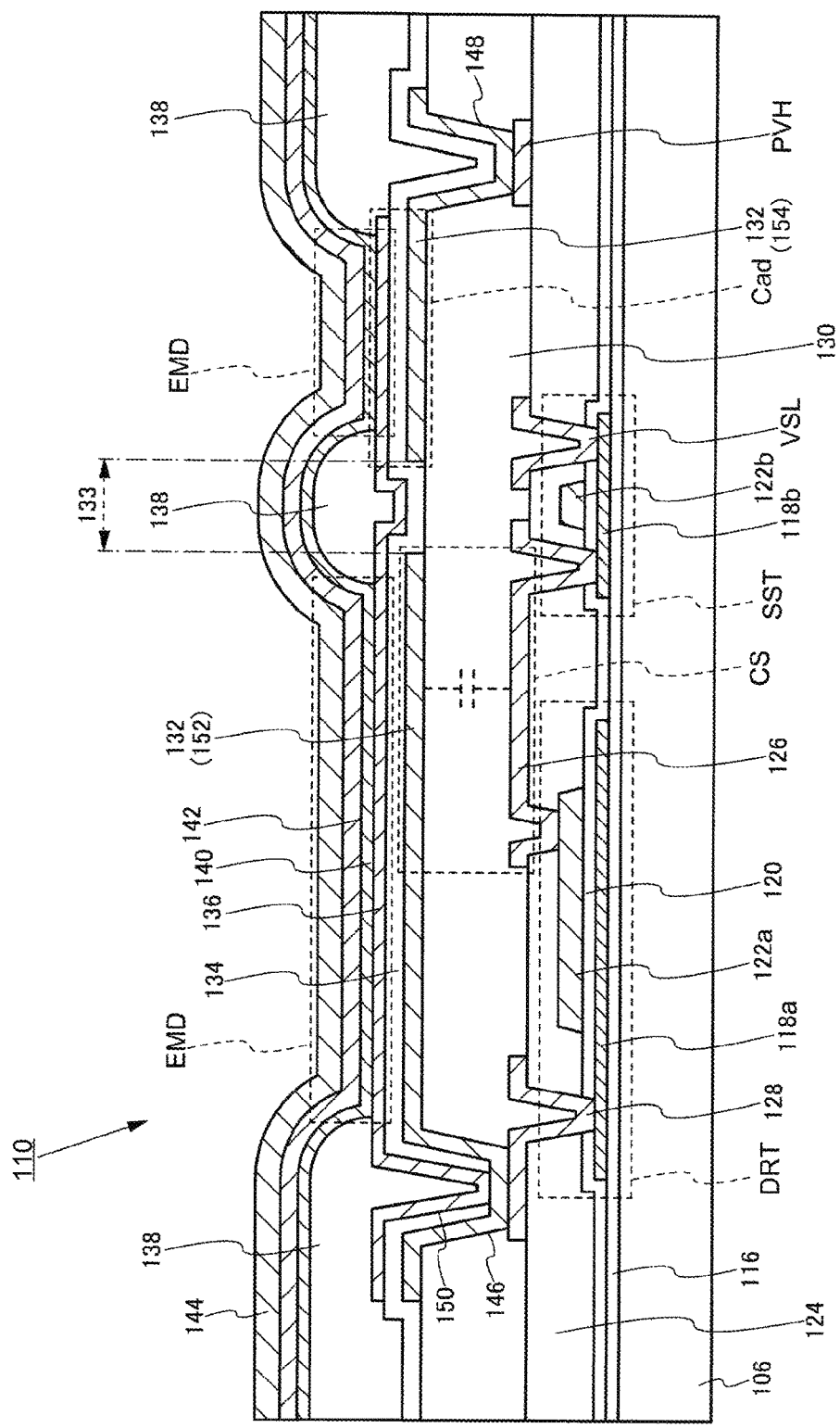
FIG. 3 is a diagram showing a cross-sectional structure of a pixel in a display device related to one embodiment of the present invention.

A structure of a display device related to one embodiment of the present invention is explained while referring to FIG. 1, FIG. 2, and FIG. 3.

1-1. Overall Structure of Display Device

FIG. 1 shows a structure of a display device 100 related to one embodiment of the present invention. The display device 100 includes a display panel 102 and a controller 104 for controlling operation of the display panel 102. The display panel 102 includes a display part 108 arranged on a base 106 and a driving circuit part 112 arranged around the display part 108. The display part 108 is arranged with a plurality of pixels 110. In addition, a first signal line VSL, a first scanning signal line SLA, a second scanning signal line SLB, and a second signal line VRS are arranged in the display part 108. The driving circuit part 112 includes a first driving circuit 114a, a second driving circuit 114b and a third driving circuit 114c. The first driving circuit 114a outputs a video signal and the like to the first signal line VSL, the second driving circuit 114b outputs a scanning signal to the first scanning signal line SLA, the third driving circuit 114c outputs a scanning signal to the second scanning signal line SLB and a reset signal is output to the second signal line VRS. The controller 104 outputs a signal for operating the first driving circuit 114a, the second driving circuit 114b and the third driving circuit 114c.

The base 106 has an insulating surface. That is, the base 106 itself may be formed of an insulating material or may have a structure in which at least one insulating layer is formed on the surface regardless of the insulating properties of the base 106. As long as an insulating surface can be obtained, there is no particular limitation to the material of the base 106 and the material for forming an insulating layer. The form of the base 106 may be either a rigid flat plat base or a film shaped base having flexibility. In either case, the base 106 may be formed of a material having mechanical properties to the extent that it can support the display part 108 and the driving circuit part 112.

A pixel 110 includes a display element and a transistor for controlling the operation of the display element. The display element includes a liquid crystal element and a light emitting element. The light-emitting element is an element that emits light by luminescence, and an organic EL element structured formed an organic electroluminescence material can be applied or example. In addition, as another display element, an element using an electrochromic material may also be applied. In the present embodiment, an organic EL element is preferably used as the display element. In this case, the display panel 102 is arranged with a first power supply line PVH for supplying power to the organic EL elements in each pixel 110. Although a case where an organic EL element is arranged in each pixel is exemplified in the explanation below, the present invention is not limited thereto and any light emitting element having a similar function can be applied.

1-2. Equivalent Circuit of a Pixel

FIG. 2 shows an example of an equivalent circuit of a pixel 110. The pixel 110 includes an organic EL element EMD, a driving transistor DRT, a first switch SST, a second switch BCT, a first capacitor element CS and a second capacitor element Cad. The organic EL element EMD is arranged between the first power supply line PVH and the second power supply line PVL. A different potential than the potential of the first power supply line PVH is supplied to the second power supply line PVL. For example, a high potential PVDD is applied to the first power supply line PVH and a low potential PVSS lower than the high potential PVDD is applied to the second power supply line PVL. The organic EL element EMD is a two-terminal element. A voltage equal to or higher than a light emitting threshold voltage is applied between the two terminals of the organic EL element EMD and light is emitted when a forward current flow. The emission intensity of the organic EL element EMD changes depending on the size of the forward current within a range of actual operation.

The driving transistor DRT is arranged between the first power supply line PVH and the organic EL element EMD. An insulated gate type field effect transistor having a gate as a control terminal and a source and a drain as an input/output terminal is applied as the driving transistor DRT. One of the input/output terminals corresponding to the source and drain of the drive transistor DRT is electrically connected to the first power supply line PVH via the second switch BCT, and the other input/output terminal is electrically connected to one terminal of the organic EL element EMD. In the present embodiment, it is assumed that the driving transistor DRT is an n-channel type. In the explanation below, for the sake of convenience, in the driving transistor DRT, the input/output terminal on the side electrically connected to the first power supply line PVH is the drain, and the input/output terminal on the side electrically connected to the organic EL element EMD is the source.

The gate of the driving transistor DRT is electrically connected to the first signal line VSL via the first switch SST. That is, the first switch SST is arranged between the first signal line VSL and the gate of the driving transistor DRT. An ON/OFF operation of the first switch SST is controlled by a control signal SG (having an amplitude VGH/VGL) which is applied to the first scanning signal line SLA. Here, it is assumed that a control signal VGH is a high potential signal for turning ON the first switch SST and the control signal VGL is a low potential signal for turning OFF the first switch SST. When the first switch SST is ON, the potential of the first signal line VSL is applied to the gate of the driving transistor DRT.

The driving transistor DRT is connected in series with the organic EL element EMD via the second switch BCT between the first power supply line PVH and the second power supply line PVL. In the driving transistor DRT, a drain current is controlled by a gate voltage and a current corresponding to the drain current flows to the organic EL element EMD. The emission intensity of the organic EL element EMD is controlled by the driving transistor DRT.

A first capacitor element CS is arranged between the source and gate of the driving transistor DRT. The first capacitor element CS holds a voltage between the gate and source of the driving transistor DRT. An initialization signal Vini and an image signal Vsig are provided at a predetermined timing to the first signal line VSL. The initialization signal Vini is a signal which provides a constant initialization potential. An ON/OFF state of the first switch SST is controlled at a predetermined timing in synchronization with the first signal line VSL and the initialization signal Vini or a potential based on an image signal Vsig is applied to the gate of the driving transistor DRT.

The second signal line VRS is electrically connected to the drain of the driving transistor DRT. A reset potential Vrst is applied to the second signal line VRS. The second signal line VRS is arranged with a third switch RST. The third switch RST is controlled by a control signal RG (having an amplitude VGH/VGL) applied to the third signal line SLC which is provided with the timing of applying the reset signal Vrst.

Switching elements are used for the first switch SST and second switch BCT. A transistor is applied as an example of the switching element. An insulated gate type field effect transistor similar to the driving transistor DRT is applied as a transistor used as a switching element. The first switch SST and second switch BCT are realized by n-channel transistors.

In the equivalent circuit of the pixel shown in FIG. 2, the gate of the driving transistor DRT is electrically connected to one terminal of the first switch SST, the drain is electrically connected to one terminal of the second switch BCT, and the source is electrically connected to one terminal of the organic EL element EMD. One terminal of the first switch SST is electrically connected to the gate of the driving transistor DRT and the other terminal is electrically connected to the first signal line VSL. One terminal of the second switch BCT is electrically connected to the drain of the driving transistor DRT and the other terminal is electrically connected to the first power supply line PVH. In addition, the first capacitor element CS is electrically connected between the gate and source of the driving transistor DRT. Furthermore, a second signal line VRS is connected to the drain of the driving transistor DRT. Application of a reset signal Vrst to the second signal line VRS is controlled by the third switch RST.

A second capacitor element Cad and an organic EL element capacitor Cel are shown in the equivalent circuit of the pixel shown in FIG. 2. One terminal of the second capacitor element Cad is connected to the source side of the driving transistor DRT and the other terminal is connected to the side of the first power supply line PVH (or the side of the second power supply line PVL). The second capacitor element Cad is arranged in order to secure a gate voltage Vgs corresponding to an image signal Vsig when the image signal Vsig is applied to the gate of the driving transistor DRT. The second capacitor element Cad may be arranged between the source of the driving transistor DRT and the first power supply line PVH or the second power supply line PVL.

Furthermore, a mode in which a parasitic capacitance Cp can be generated at the gate of the driving transistor DRT is shown in FIG. 2. As described herein, in the present embodiment, conducting layers forming electrodes of the first capacitor element CS and the second capacitor element Cad are appropriately separated and thereby generation of such a parasitic capacitance Cp is prevented.

1-3. Structure of a Pixel

FIG. 3 shows an example of a cross-sectional structure of a pixel 110 related to the present embodiment. Among the elements forming the pixel 110, FIG. 3 shows a cross-sectional structure of the driving transistor DRT, the first switch SST, the first capacitor element CS, the second capacitor element Cad and the organic EL element EMD. Each of these elements is arranged on one main surface of the base 106.

The driving transistor DRT includes a first semiconductor layer 118a, a gate insulating layer 120 and a first gate electrode 122a. The first semiconductor layer 118a is divided into island shapes on one main surface of the base 106. A base insulating layer 116 may be arranged between the first semiconductor layer 118a and the base 106. The gate insulating layer 120 is arranged to cover the entire surface of the first semiconductor layer 118a. The first gate electrode 122a is arranged to intersect at least a part of the first semiconductor layer 118a with the gate insulating layer 120 interposed therebetween. The driving transistor DRT is formed with a channel in a region where the first semiconductor layer 118a overlaps with the first gate electrode 122a. The first semiconductor layer 118a has a region other than the region where the channel is formed which functions as a source region or a drain region. In the first semiconductor layer 118a, the source region and the drain region are arranged so as to sandwich a region where a channel is formed. The driving transistor DRT has a structure of an insulated gate type field effect transistor in which a gate electrode is insulated by a gate insulating layer.

An interlayer insulating layer 124 is arranged above the first gate electrode 122a. The interlayer insulating layer 124 is arranged spread over roughly the entire surface of the pixel 110. A second wiring 128 is arranged on an upper layer side of the interlayer insulating layer 124. The second wiring 128 is connected to a region corresponding to a source region or a drain region of the first semiconductor layer 118a by a contact hole which passes through the interlayer insulating layer 124 and the gate insulating layer 120.

The first switch SST includes a second semiconductor layer 118b, a gate insulating layer 120 and a second gate electrode 122b. The second semiconductor layer 118b is arranged in a form separated into islands on one main surface of the base 106. The second semiconductor layer 118b is separated from the first semiconductor layer 118a. The first switch SST is realized by a transistor and has the same structure as an insulated gate field effect transistor the same as the driving transistor DRT. As shown in the equivalent circuit in FIG. 2, one of the source region and the drain region corresponding to the input/output terminals of the first switch SST is connected to the first gate electrode 122a of the driving transistor DRT by first wiring 126, and the other is connected to the first signal line VSL. The first wiring 126 and the first signal line VSL are formed by the same conducting layer as the second wiring 128. In addition, the first power supply line PVH is arranged by the same conducting layer as the second wiring 128.

A silicon semiconductor such as hydrogenated amorphous silicon, polysilicon or the like or an oxide semiconductor formed from a metal oxide having semiconductor characteristics is applied as the first semiconductor layer 118a and the second semiconductor layer 118b. Silicon oxide or silicon nitride can be used for the gate insulating layer 120. The gate electrode 122 is formed of a metal material such as copper, molybdenum, tantalum, tungsten, molybdenum-tungsten or aluminum. Silicon oxide or silicon nitride can be used for the interlayer insulating layer 124. Aluminum is used for the first wiring 126, the second wiring 128, the first signal line VSL and the first power supply line PVH and a metal film such as titanium, molybdenum or tungsten and the like is arranged on an upper layer and lower layer of the aluminum film.

A first insulating layer 130 is arranged on an upper layer of the first wiring 126 and second wiring 128. The first insulating layer 130 buries the first wiring 126 and second wiring 128 to form a flat surface. A conducting layer 132 is arranged on an upper surface of the first insulating layer 130. A second insulating layer 134 is arranged on the upper layer side of the conducting layer 132. A pixel electrode 136 is arranged on the upper layer side of the second insulating layer 134. The pixel electrode 136 and the conducting layer 132 are arranged to overlap each other sandwiching the second insulating layer 134.

The conducting layer 132 is divided into a plurality of regions by a dividing groove 133. The conducting layer 132 is divided into at least a first conducting region 152 and a second conductive region 154 by the dividing groove 133. The first conducting region 152 includes a region where at least a part of the first conducting region 152 overlaps with the first wiring 126 via the first insulating layer 130. The first conducting region 152 is connected to the second wiring 128 by a first contact hole 146 arranged in the first insulating layer 130. In addition, the pixel electrode 136 is connected to the first conducting region 152 by a second contact hole 150 arranged in the second insulating layer 134. On the other hand, the second conducting region 154 includes a region where at least a part of the second conducting region 154 overlaps with the pixel electrode 136 via the second insulating layer 134. The second conducting region 154 is arranged in a region which does not overlap with the first wiring 126 and the first gate electrode 122a by the dividing groove 133. The second conducting region 154 is connected to the first power supply line PVH by a third contact hole 148 arranged in the first insulating layer 130.

The first conducting region 152 overlaps with the first wiring 126 via the first insulating layer 130 thereby forming the first capacitor element CS. The first conducting region 152 also overlaps with the pixel electrode 136 via the second insulating layer 134. However, as is clear from the connection relationship described above, since the first conducting region 152 and the pixel electrode 136 become the same potential, a state is obtained in which roughly no capacitance is formed between the two. The second conducting region 154 overlaps with the pixel electrode 136 via the second insulating layer 134 thereby forming the second capacitor element Cad. Although the second conducting region 154 has the same potential as the first power supply line PVH, it does not overlap with the first wiring 126 and the first gate electrode 122a and thereby the parasitic capacitance Cp as shown in FIG. 2 is not formed. In this way, in the case when the conducting layer 132 is arranged between the first insulating layer 130 and the second insulating layer 134, the conducting layer 132 is divided into a plurality of regions (first conducting region 152 and second conducting region 154) and thereby it is possible to prevent unintended parasitic capacitance Cp being generated.

The first insulating layer 130 can be manufactured of an inorganic insulating material such as silicon oxide or an organic insulating material such as polyimide and acrylic. For example, the first insulating layer 130 is formed using an organic insulating material by a coating method, a vapor deposition polymerization method or a printing method and or the like. The second insulating layer 134 is formed using an inorganic insulating material such as silicon nitride. For example, the second insulating layer 134 is made of an inorganic insulating material by a plasma CVD method and the like. The conducting layer 132 is manufactured by a metal material similar to the first wiring 126 and the like. In addition, the conducting layer 132 may be manufactured by a conductive metal oxide (for example, indium tin oxide and the like).

A third insulating layer 138 is arranged on the upper layer side of the second insulating layer 134 and the pixel electrode 136. The third insulating layer 138 includes an opening part which exposes the upper surface of the pixel electrode 136 and is arranged to cover a peripheral part of the pixel electrode 136. In the third insulating layer 138, it is preferred that the opening end part of the opening part has an inclined surface. The third insulating layer 138 having such a form is preferred to be formed from an organic insulating material. The third insulating layer 138 is a layer also called a bank or partition wall and is a layer that defines a light emitting region of a pixel 110.

The dividing groove 133 for dividing the conducting layer 132 into a plurality is included in a region of the pixel 110. Since the conducting layer 132 is interrupted by the dividing groove 133, a pixel electrode 136 arranged via the second insulating layer 134 includes a step part in a region which overlaps with the dividing groove 133. When a step is present in the pixel electrode 136, the organic layer 140 arranged on an upper layer thereof is not sufficiently covered and there is concern that aa common electrode 142 arranged on an upper layer of the organic layer 140 may short circuit with the pixel electrode 136. Therefore, it is preferred to arrange the third insulating layer 138 also in a region which overlaps the step part of the pixel electrode 136. By arranging the third insulating layer 138, the organic layer 140 and the common electrode 142 can be prevented from being formed at the step part of the pixel electrode 136.

The organic layer 140 is arranged along a surface of the third insulating layer 138 from an upper surface of the pixel electrode 136. A common electrode 142 is arranged on an upper layer of the organic layer 140. The organic EL element EMD is formed in a region where the pixel electrode 136, the organic layer 140 and the common electrode 142 overlap. That is, this region serves as a light emitting region where the pixel electrode 136, the organic layer 140, and the common electrode 142 overlap.

The organic layer 140 is a layer including a low molecular or high molecular organic electroluminescent material. In the case where a low molecular organic electroluminescent material is used as a light emitting material to the light emitting layer, the organic layer 140 may include a hole injection layer, a hole transport layer, an electron injection layer, an electron transport layer and the like. For example, the organic layer 140 may have a structure in which a light emitting layer including an organic electroluminescent material is sandwiched between a hole injection layer and an electron injection layer. In addition to these layers, a hole transporting layer, an electron transporting layer, a hole blocking layer, an electron blocking layer and the like may be appropriately added to the organic layer 140. In addition, different organic electroluminescent materials may be used for each of a pixel corresponding to red, a pixel corresponding to green and the pixel corresponding to blue as the organic electroluminescent material. In this case, at least the light emitting layer may be arranged discontinuously for each pixel corresponding to each color.

Furthermore, in the present embodiment, it is assumed that the organic EL element EMD has a so-called top emission type structure in which light emitted by the organic layer 140 is emitted to the common electrode 142 side. In this case, the pixel electrode 136 has a structure in which a metal film with high reflectance or a metal film and a transparent conducting film are stacked in order to reflect light emitted by the organic layer 140 to the common electrode 142 side. For example, in the case where the organic layer 140 is stacked in order with a hole injection layer, light emitting layer and an electron injection layer, it is preferred that the pixel electrode 136 is made of a material with a high work function such as ITO (Indium Tin Oxide) or IZO (Indium Zinc Oxide) or the like which have excellent hole injection properties. While ITO is a type of translucent conducting material and has high transmittance in the visible light band, it has very low reflectance. Therefore, in order to add a function of reflecting light to the pixel electrode 136, it is preferred to apply a stacked structure of a translucent conducting film and a metal film. The metal film is preferably formed using aluminum (Al), silver (Ag) or an alloy material of these containing a metal as a main component. On the other hand, in order to supply electrons to the electron injection layer, the common electrode 142 is preferred to be formed of a conducting material having a low work function. For example, the common electrode 142 is preferred to be formed using a thin metal material such as magnesium-silver (Mg—Ag), lithium-aluminum (Li—Al) or lithium fluoride-aluminum (LiF—Al). Furthermore, it is preferred that the metal material is a sufficiently thin metal material so as to function as a top emission, and has a thickness of preferably about 5 to 20 nm. In either case, in the case of a top emission type, light emitted by the organic layer 140 is emitted to the upper surface side of the pixel electrode 136, thereby the aperture ratio is not affected even if the conducting layer 132 is arranged on the lower layer side of the pixel electrode 136.

A sealing layer 144 is arranged on an upper layer of the common electrode 142. The sealing layer 144 covers roughly the entire surface of the organic EL element EMD and is arranged to prevent the entrance of moisture or the like. Although there is no limitation to the material and structure of the sealing layer 144, the sealing layer 144 may have a stacked structure in which the upper and lower sides of the organic insulating layer are sandwiched by inorganic insulating layers. It is preferred that the sealing layer 144 has a structure in which the upper layer side and the lower layer side of the organic insulating layer formed from an acrylic resin, an epoxy resin or a polyimide resin for example, are sandwiched between silicon nitride layers.

According to the present embodiment, by arranging the conducting layer 132 so as to be sandwiched by an insulating layer between the driving transistor DRT and the organic EL element EMD, it is possible to use the conducting layer 132 as an electrode of a capacitor. In this case, by separating the conducting layer 132 into the first conducting region 152 which overlaps with the first wiring 126, and the second conducting region 154 which overlaps with the pixel electrode 136 but does not overlap with the first wiring 126, it is possible to prevent the formation of the parasitic capacitance Cp at the gate of the driving transistor DRT.

In other words, as is shown in FIG. 3, by arranging a conducting layer 132 is arranged between the first insulating layer 130 and the second insulating layer 134, and separating this conducting layer into the first conducting region 152 having a region which overlaps with the first wiring 126, and the second conducting region 154 which does not overlap with the first wiring 126, it is possible to form the first capacitor element CS which holds the gate-source voltage of the driving transistor DRT using the first conducting region 152, and it is possible to form the second capacitor element Cad which prevents a decrease in the gate-source voltage of the driving transistor DRT at the time of writing an image signal by the second conducting region 154. In this case, because the first conducting region 152 and the second conducting region 154 are electrically separated, it is possible to prevent generation of the parasitic capacitance Cp at the gate of the driving transistor DRT.

Second Embodiment

Figure 4:
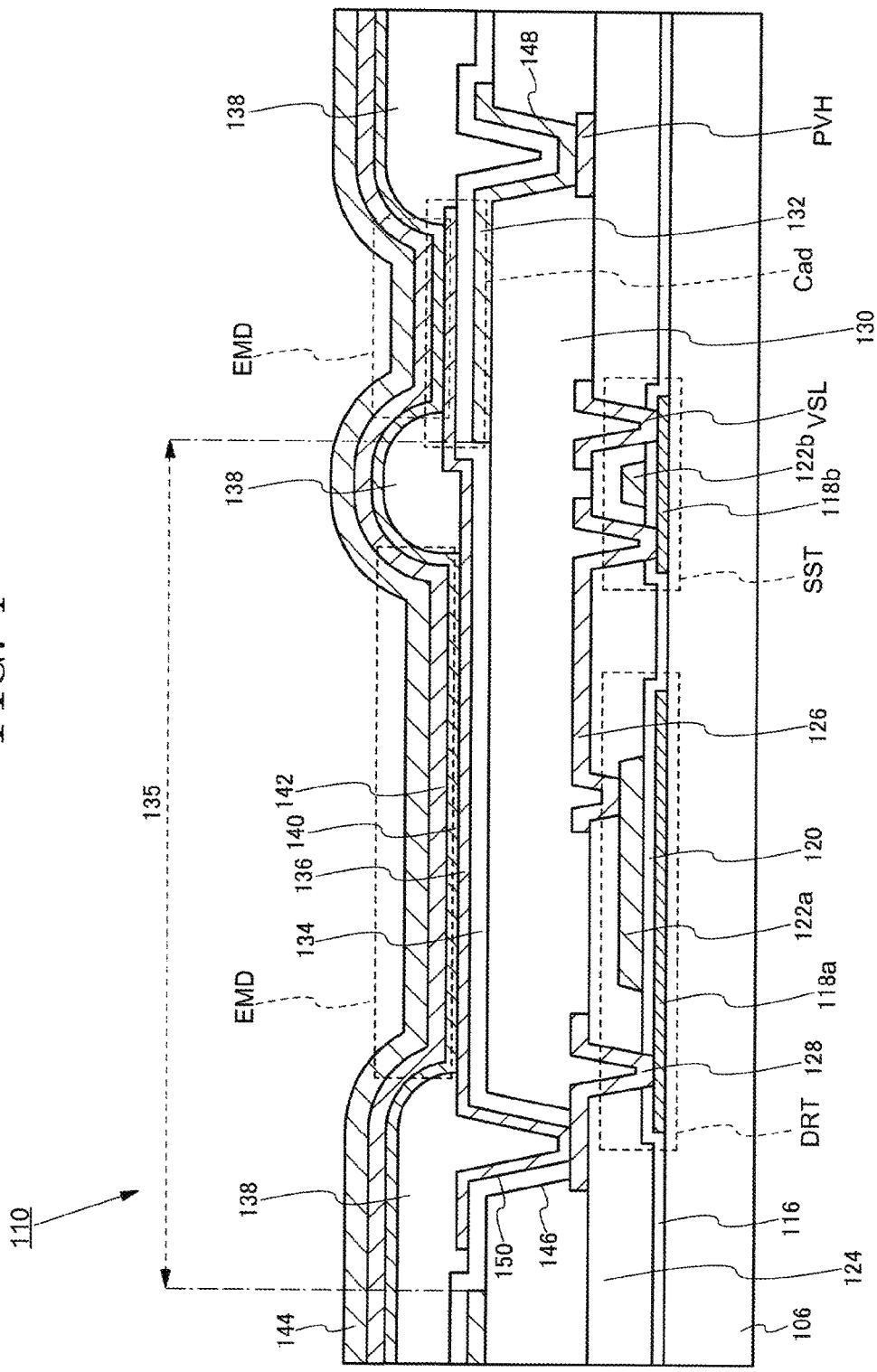
FIG. 4 is a diagram showing a cross-sectional structure of a pixel in a display device related to one embodiment of the present invention.

A structure of a display device related to one embodiment of the present invention is explained while referring to FIG. 4. In the present embodiment, parts different from those of the first embodiment are explained and repetitive explanations of common parts are omitted.

FIG. 4 shows an example of a cross-sectional structure of a pixel 110 related to the present embodiment. Among the elements forming the pixel 110, FIG. 4 shows a cross-sectional structure of the driving transistor DRT, the first switch SST, the second capacitor element Cad and the organic EL element EMD. As in the first embodiment, the conducting layer 132 is arranged between the first insulating layer 130 and the second insulating layer 134. In the present embodiment, the conducting layer 132 in a region overlapping with the first wiring 126 is removed. In other words, the conducting layer 132 is arranged with an opening part 135 in a region which overlaps with the first wiring 126. The conducting layer 132 is connected to the first power supply line PVH. However, because the opening part 135 is arranged in the conducting layer 132, a capacitance is not formed between the conducting layer 132 and the first wiring 126. That is, the parasitic capacitance Cp shown in FIG. 2 is not formed.

On the other hand, since the conducting layer 132 is connected to the first power supply line PVH, the second capacitor element Cad is formed in a region which overlaps with the pixel electrode 136 the same as the first embodiment. Furthermore, a capacitor element corresponding to the first capacitor element CS explained in the first embodiment can be formed with a conducting layer forming a gate electrode, a conducting layer forming a first wiring, and an interlayer insulating layer. As another embodiment, a capacitor element can be formed by a conducting layer forming a gate electrode, a gate insulating layer and a semiconductor layer.

As described above, according to the present embodiment, by arranging the conducting layer 132 so as to be sandwiched by insulating layers between the driving transistor DRT and the organic EL element EMD, it is possible to use the conducting layer 132 as an electrode of a capacitor element. In this case, by arranging the opening part 135 in a region where the conducting layer 132 overlaps with the first wiring 126, it is possible to prevent formation of parasitic capacitance Cp that varies a gate-source voltage of the driving transistor DRT.

Third Embodiment

In the present embodiment, details of the pixel shown in the first embodiment are explained according to a manufacturing process. In the present embodiment, FIG. 5A, FIG. 6A, FIG. 7A, and FIG. 8A are planar views of a pixel, and FIG. 5B, FIG. 6B, FIG. 7B, and FIG. 8B show a cross-sectional structure along the line A-B shown in the planar view diagrams.

Figure 5A:
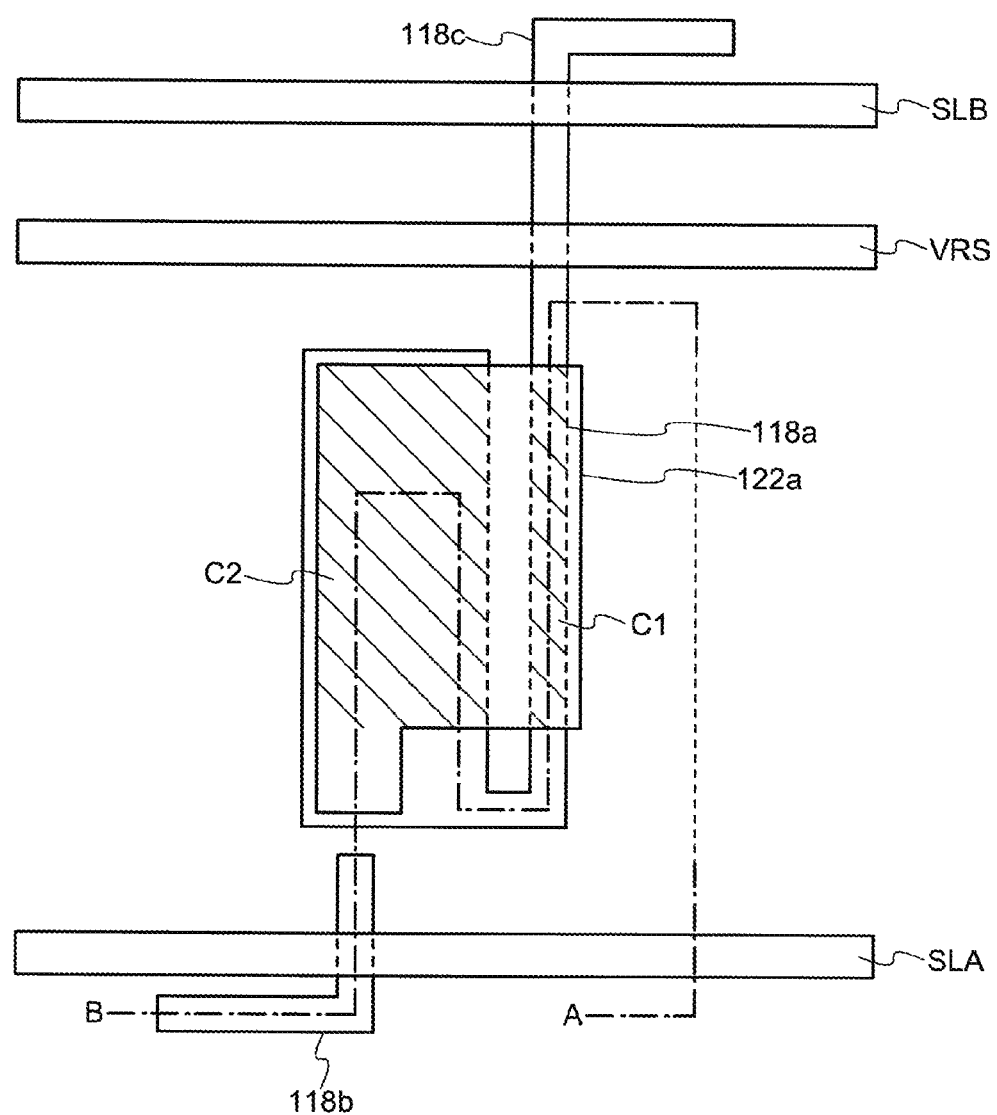
FIG. 5A is a planar view diagram for explaining a manufacturing process of a pixel in a display device related to one embodiment of the present invention.
Figure 5B:
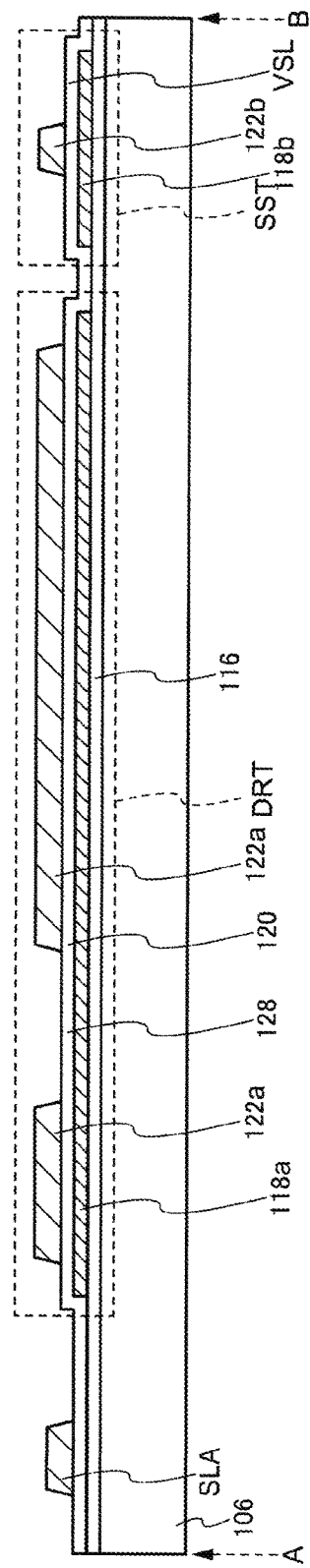
FIG. 5B is a cross-sectional diagram for explaining a manufacturing process of a pixel in a display device related to one embodiment of the present invention.

FIG. 5A and FIG. 5B show stages of manufacturing the first semiconductor layer 118a, the second semiconductor layer 118b, the gate insulating layer 120, the first gate electrode 122a and the second gate electrode 122b. A glass substrate, an organic resin film made of polyimide or the like is used as the base 106. It is preferred that a base insulating layer 116 is arranged on one main surface of the base 106. The base insulating layer 116 is formed from a silicon nitride film, a silicon oxide film, a silicon oxynitride film or a stacked body of a plurality of insulating films selected these. These inorganic insulating films are manufactured by a plasma CVD method or a sputtering method. The method of manufacturing an inorganic insulating layer is the same in subsequent steps.

The first semiconductor layer 118a, second semiconductor layer 118b, and third semiconductor layer 118c are formed above the base insulating layer 116. In FIG. 5A, the first semiconductor layer 118a and the third semiconductor layer 118c are arranged continuously. The first semiconductor layer 118a, the second semiconductor layer 118b and the third semiconductor layer 118c are formed by forming a semiconductor thin film on roughly the entire surface of the base insulating layer 116 and etching into a predetermined pattern according to the arrangement of a transistor. As described above, a semiconductor layer is formed from a silicon semiconductor or an oxide semiconductor.

A gate insulating layer 120 is formed on an upper layer of the first semiconductor layer 118a, the second semiconductor layer 118b and the third semiconductor layer 118c so as to cover roughly the entire surface of the base 106. The gate insulating layer 120 is manufactured from a silicon oxide film, a silicon nitride film and a silicon oxynitride film and the like. A first gate electrode 122a, a second gate electrode 122b and a third gate electrode 122c are formed on the gate insulating layer 120. The gate electrode is formed of a metal material such as copper, molybdenum, tantalum, tungsten, molybdenum-tungsten or aluminum and the like. In addition, a first scanning signal line SLA, a second scanning signal line SLB and a second signal line VRS are formed in the same layer as these gate electrodes. Furthermore, the second gate electrode 122b corresponds to a region where the second semiconductor layer 118b overlaps with the first scanning signal line SLA, and the third gate electrode 122c corresponds to a region where the second scanning signal line SLB overlaps with the third semiconductor layer 118c.

A region (region C1 shown in FIG. 5A) which overlaps with the first gate electrode 122a serves as a channel, and the first semiconductor layer 118a is doped with impurities which impart one conductivity type in a region other than this region, thereby a source region and a drain region are formed. The relationship between the second semiconductor layer 118b and the second gate electrode 122b and the third semiconductor layer 118c and the third gate electrode 122c is the same. In this way, in the pixel 110, the positions of the driving transistor DRT, the first switch SST and the second switch BCT are defined. Furthermore, in the first semiconductor layer 118a, by imparting conductivity by doping impurities of one conductivity type to the region C2, it is possible to form a part of a capacitor element in a region where the semiconductor region C1, the gate insulating layer 120 and the first gate electrode 122a overlap with each other.

Figure 6A:
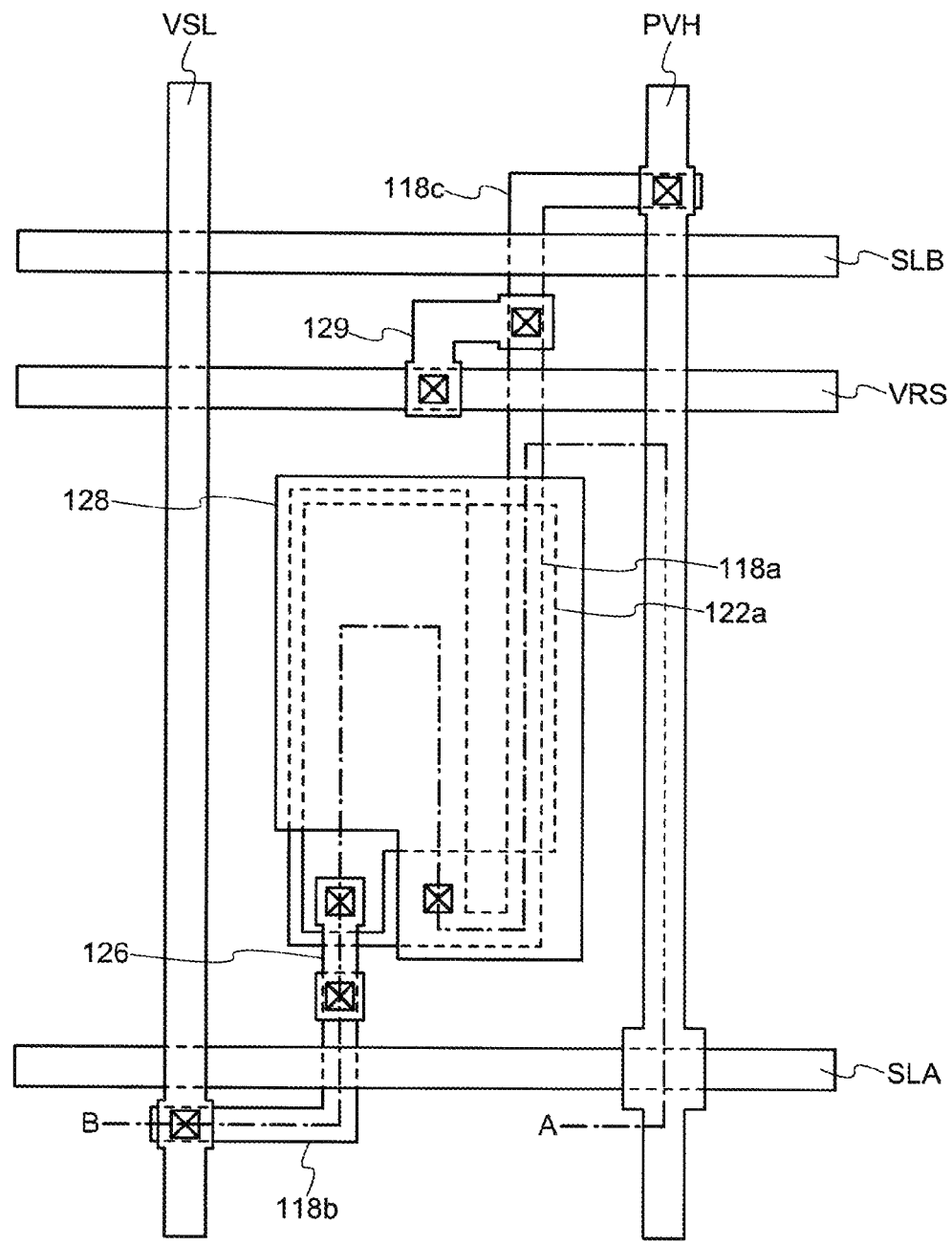
FIG. 6A is a planar view diagram for explaining a manufacturing process of a pixel in a display device related to one embodiment of the present invention.
Figure 6B:
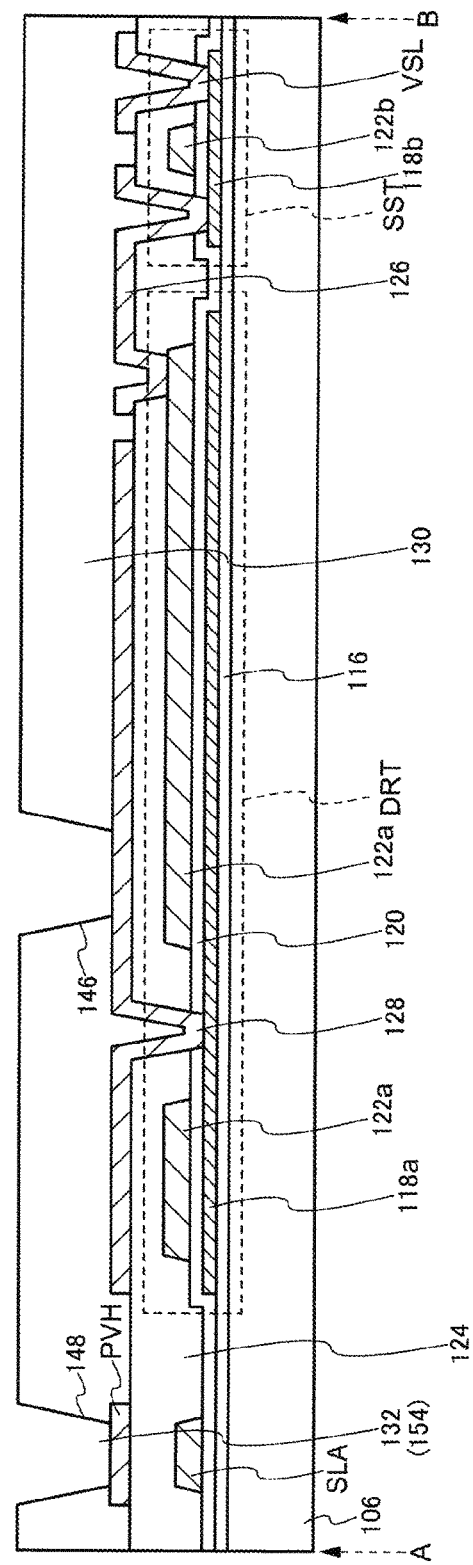
FIG. 6B is a cross-sectional diagram for explaining a manufacturing process of a pixel in a display device related to one embodiment of the present invention.

FIG. 6A and FIG. 6B shows stages for forming the interlayer insulating layer 124, the first wiring 126, the second wiring 128, the first signal line VSL, the first power supply line PVH and the third wiring 129. The interlayer insulating layer 124 is arranged on roughly the entire surface of the region where the pixel 110 is formed. The interlayer insulating layer 124 is preferably formed from an inorganic insulating material and is formed of one layer or a plurality of layers selected from a silicon nitride film, a silicon oxide film and a silicon oxynitride film. Each wiring is formed after a contact hole is formed in a predetermined region of the interlayer insulating layer 124. In the driving transistor DRT, the first gate electrode 122a is connected to the first wiring 126 by the contact hole formed in the interlayer insulating layer 124, and one of the source region and the drain region is connected to the second wiring 128. One of input/output terminals in the first switch SST is connected to the first wiring 126 and the other is connected to the first signal line VSL by the contact hole formed in the interlayer insulating layer 124. One of the input/output terminals in the second switch BCT is connected to the first power supply line PVH. The third wiring 129 is wiring which connects the drain region side of the driving transistor DRT with the second signal line VRS. These wirings are formed of an aluminum film, and a structure is adopted in which a metal film of titanium, molybdenum or tungsten and the like is stacked on an upper layer and a lower layer of the aluminum film.

The first insulating layer 130 is formed on an upper layer of the interlayer insulating layer 124 so as to embed the first wiring 126, the second wiring 128, the first signal line VSL, the first power supply line PVH and the third wiring 129. The first insulating layer 130 is formed from an inorganic insulating material such as silicon oxide or an organic insulating material such as polyimide and acrylic. The first insulating layer 130 has a function as a planarization film for flattening a surface by filling a step using wiring or a contact hole arranged in a lower layer.

Figure 7A:
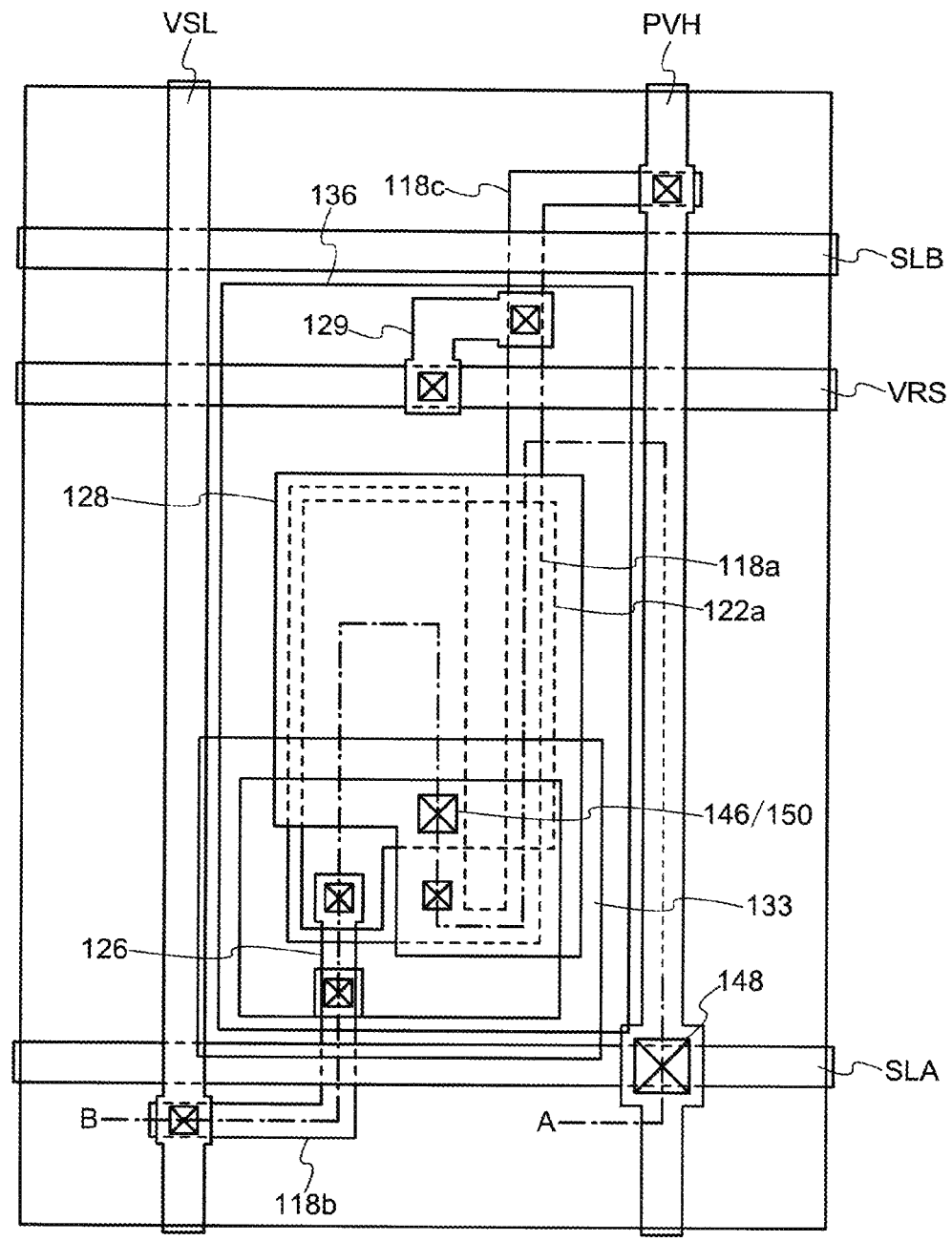
FIG. 7A is a planar view diagram for explaining a manufacturing process of a pixel in a display device related to one embodiment of the present invention.
Figure 7B:
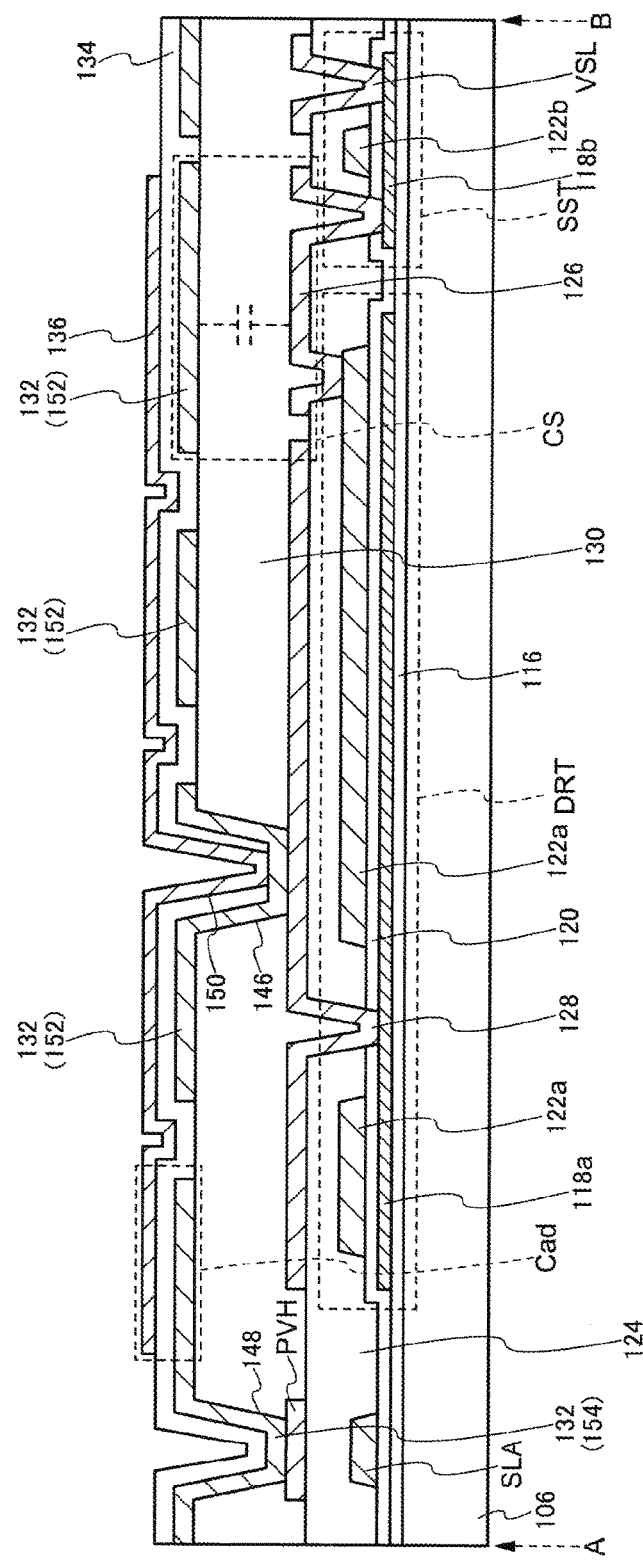
FIG. 7B is a cross-sectional diagram for explaining a manufacturing process of a pixel in a display device related to one embodiment of the present invention.

FIG. 7A and FIG. 7B show stages for forming the conducting layer 132, the second insulating layer 134 and the pixel electrode 136. First, a first contact hole 146 and a third contact hole 148 are formed in the first insulating layer 130. The first contact hole 146 exposes a part of the second wiring 128, and the third contact hole 148 exposes a part of the first power supply line PVH. Following this, the conducting layer 132 is formed on roughly the entire surface of a region where the pixel 110 is formed. The conducting layer 132 is formed using the same metal material as a gate electrode or first wiring. In addition, the conducting layer 132 may be manufactured from a metal oxide (for example, indium tin oxide or the like) having conductivity. Following this, a dividing groove 133 is formed in the conducting layer 132 which is divided into a plurality of regions. The dividing groove 133 is formed by arranging a mask by photolithography and etching the conducting layer 132. The dividing groove 133 is formed so that the conducting layer 132 is divided into a region overlapping with the first wiring 126 and a region which does not overlap with the first wiring 126. In this way, the conducting layer 132 is divided into a first conducting region 152 which at least partially overlaps with the first wiring 126 and a second conducting region 154 which are regions other than the first conducting region 152. In addition, the first conducting region 152 is connected to the second wiring 128 through the first contact hole 146, and the second conducting region 154 is connected to the first power supply line PVH through the third contact hole 148.

The second insulating layer 134 is formed on an upper layer of the conducting layer 132. The second insulating layer 134 is preferred to be formed from an inorganic insulating film such as a silicon oxide film or a silicon nitride film. As another embodiment, the second insulating layer 134 may be formed from an organic insulating film such as acrylic or polyimide. For the purpose of forming a capacitor element between the conducting layer 132 and the pixel electrode 136 formed above the second insulating layer 134, the second insulating layer 134 is preferred to be formed from an inorganic insulating material such as a silicon nitride film having a relatively high dielectric constant.

A second contact hole 150 is formed in the second insulating layer 134. The second contact hole 150 is arranged to electrically connect the pixel electrode 136 and the second wiring 128. Although the position of the second contact hole 150 is arbitrary, for example, it is formed concentrically with the first contact hole 146. By arranging the second contact hole 150 so as to at least partially overlap with the first contact hole 146, the area of a light emitting region in a pixel can be increased. The second insulating layer 134 is formed so as to cover the dividing groove 133 of the conducting layer 132. In the case when the second insulating layer 134 is formed of an inorganic insulating layer such as a silicon nitride film, a film is formed along the step formed by the dividing groove 133. As a result, a step is formed on the surface of the second insulating layer 134 in a region including the dividing groove 133.

A pixel electrode 136 is formed above the second insulating layer 134. The pixel electrode 136 is formed by a transparent conductive film or a stacked structure of a metal film and a transparent conductive film. The pixel electrode 136 is electrically connected to the second wiring 128 through the second contact hole 150. In the case when the second contact hole 150 is arranged concentrically with the first contact hole 146, the pixel electrode 136 is connected to the first conducting region 152 of the conducting layer 132. Since the first conducting region 152 is connected to the second wiring 128, the pixel electrode 136 is essentially electrically connected to the second wiring 128. Furthermore, the pixel electrode 136 is formed along the step of the second insulating layer 134 (the step formed by the dividing groove 133). As a result, a step portion is also formed in an inner side region of the pixel electrode 136 itself.

Figure 8A:
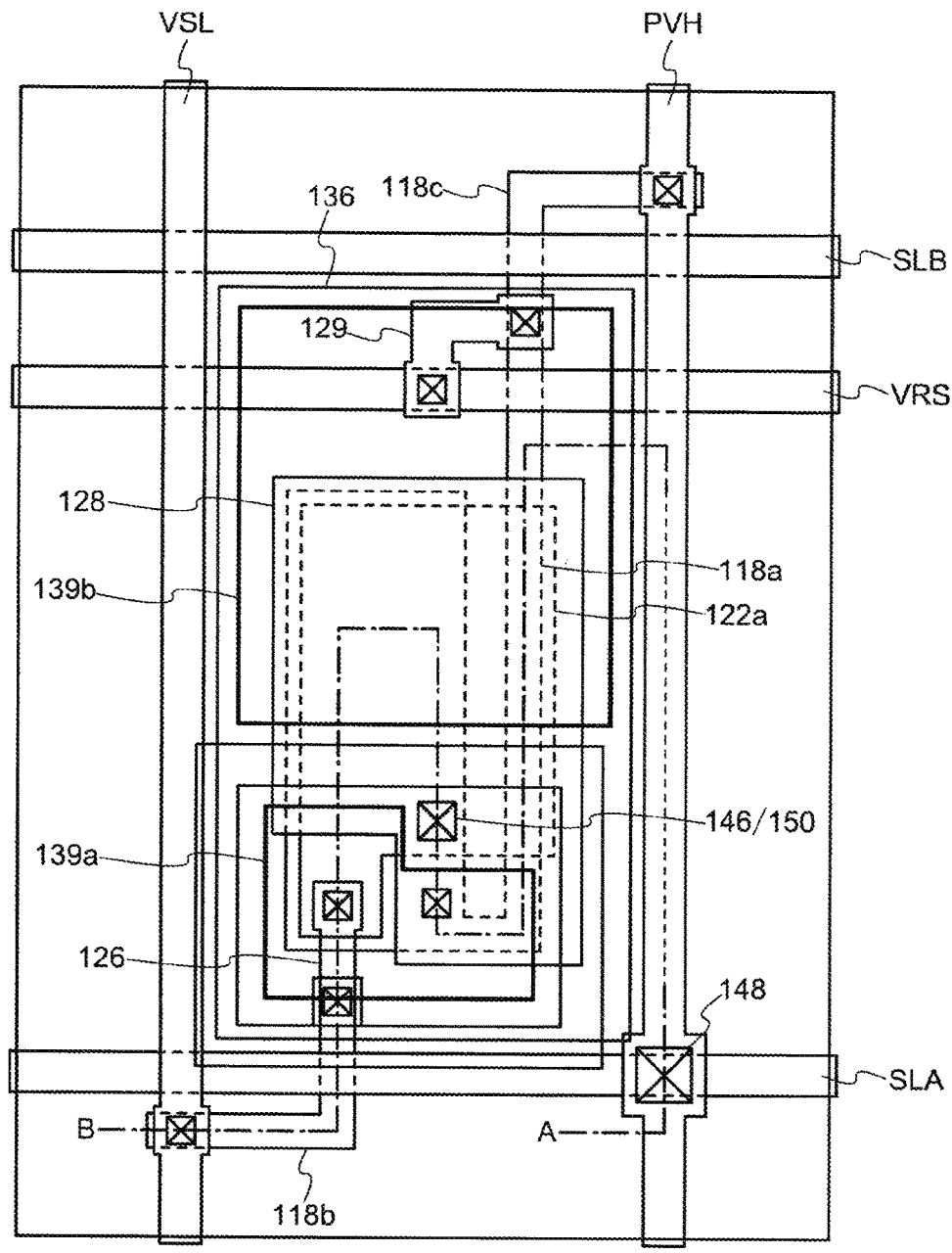
FIG. 8A is a diagram showing a planar structure of a pixel in a display device related to one embodiment of the present invention.
Figure 8B:
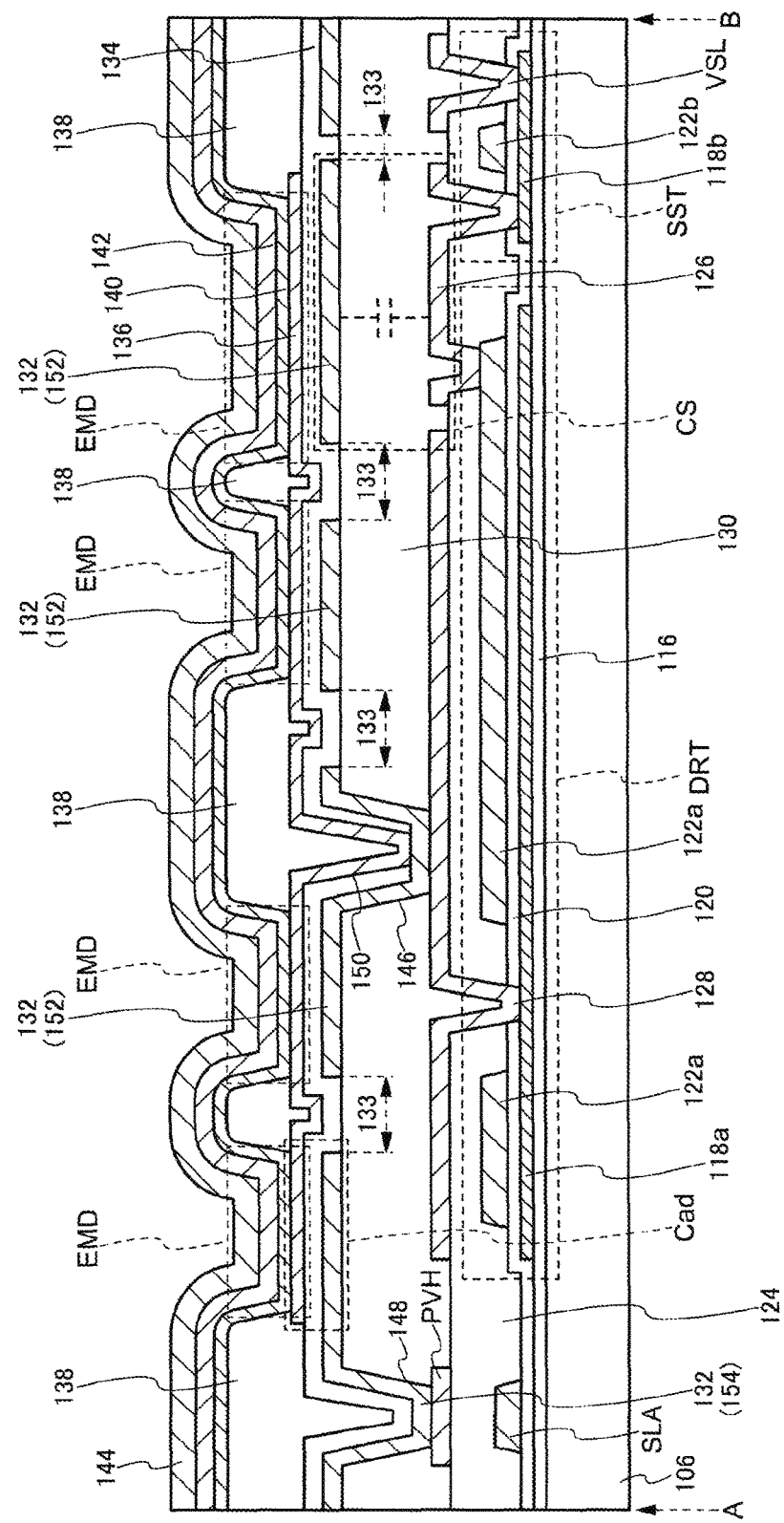
FIG. 8B is a diagram showing a cross-sectional structure of a pixel in a display device related to one embodiment of the present invention.

FIG. 8A and FIG. 8B shows stages for forming the third insulating layer 138, the organic layer 140, the common electrode 142 and the sealing layer 144. The third insulating layer 138 is a region also called a bank layer or a partition wall layer and is arranged so as to cover a periphery part of the pixel electrode 136 so as to bury the second contact hole 150. That is, the third insulating layer 138 has an opening part which exposes the inner side region of the pixel electrode 136 and is arranged so as to overlap with the periphery part and the second contact hole. Furthermore, in the present embodiment, the third insulating layer 138 is also arranged so as to embed the step part (region overlapping with the dividing groove 133) of the pixel electrode 136.

In other words, the third insulating layer 138 is provided so as to divide a light emitting region of a pixel. FIG. 8A shows an open end 139a and an open end 139b of the third insulating layer 138, and the light emitting region is divided into a plurality in one pixel 110.

It is preferred that the open end in the third insulating layer 138 has a gently inclined surface. With such a form, it is possible to form the organic layer 140 formed with a thickness of about 100 nm to 200 nm from an upper surface of the pixel electrode 136 to the third insulating layer 138 with continuity maintained. A common electrode 142 having translucency is formed on an upper layer of the organic layer 140. The pixel electrode 136, the organic layer 140 and the common electrode 142 are stacked to form the organic EL element EMD, and the region where these three layers are stacked is a light emitting region. The common electrode 142 is formed from a semi-transparent film of a metal material such as magnesium-silver (Mg—Ag), lithium-aluminum (Li—Al) or lithium fluoride-aluminum (LiF—Al).

The sealing layer 144 is formed on an upper layer of the common electrode 142 by an insulating film having translucency. For example, the sealing layer 144 is formed with a structure in which a silicon nitride film is stacked on the upper layer side and the lower layer side of an organic insulating film formed from an acrylic resin, epoxy resin or polyimide resin.

According to the structure of the shown in FIG. 8A and FIG. 8B, the first conducting region 152 of the conducting layer 132 and the first wiring 126 are provide with different potentials. The same potential as the source of the driving transistor DRT is applied to the first conducting region 152, and the same potential as the first gate electrode 122a of the driving transistor DRT is applied to the first wiring 126. At least a part of the first conducting region 152 and the first wiring 126 are arranged to sandwich the first insulating layer 130 so that the first capacitor element CS is formed in this region. Since the first conducting region 152 has the same potential as the pixel electrode 136, even if the first conducting region 152, the second insulating layer 134, and the pixel electrode 136 are arranged so as to overlap with each other, the first conducting region 152 essentially does not function as a capacitor element. On the other hand, the second conducting region 154 is connected to the first wiring 126. In this way, the second capacitive element Cad is formed in a region where the second conducting region 154, the second insulating layer 134 and the pixel electrode 136 overlap.

According to the present embodiment, by arranging the conducting layer 132 so as to be sandwiched by insulating layers between the driving transistor DRT and the organic EL element EMD, it is possible to use the conducting layer 132 as an electrode of a capacitor element. In this case, by separating the conducting layer 132 into the first conducting region 152 which overlaps with the first wiring 126, and the second conducting region 154 which overlaps with the pixel electrode 136 but does not overlap with the first wiring 126, it is possible to prevent parasitic capacitance Cp being formed at the gate of the driving transistor DRT. In a comparison of the equivalent circuit of the pixel shown in FIG. 2, using the stacked structure of the first conducting region 152, the first insulating layer 130 and the first wiring 126, it is possible to form the first capacitor element CS which holds a gate-source voltage of the driving transistor DRT. In addition, the second capacitor element Cad for preventing a decrease in the gate-source voltage of the driving transistor DRT at the time of writing an image signal can be formed using the stacked structure of the second conducting region 154, the second insulating layer 134 and the pixel electrode 136. In this case, because the first conducting region 152 and the second conducting region 154 are electrically separated, it is possible to prevent generation of parasitic capacitance Cp at the gate of the driving transistor DRT.

Fourth Embodiment

Figure 9A:
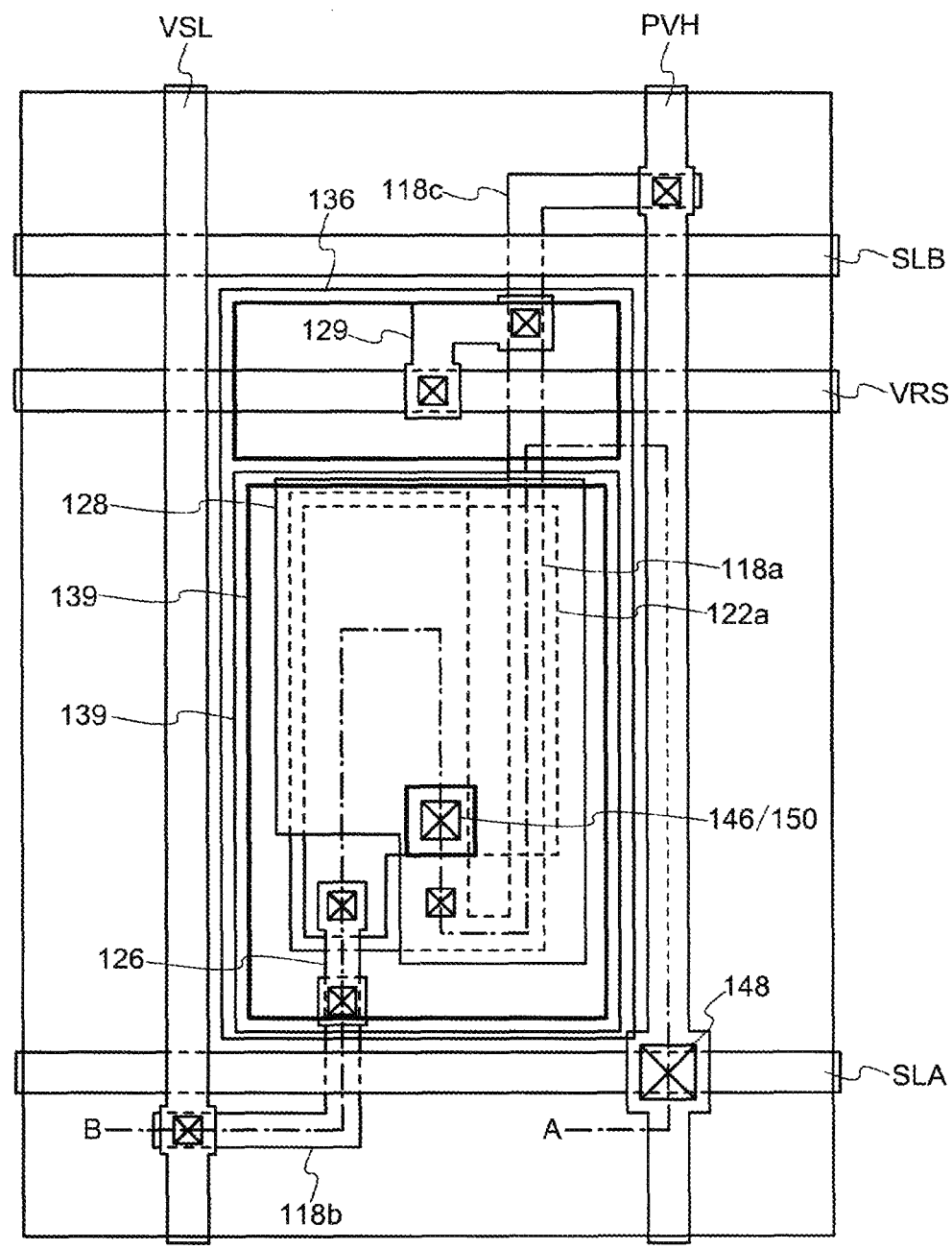
FIG. 9A is a diagram showing a planar structure of a pixel in a display device related to one embodiment of the present invention.
Figure 9B:
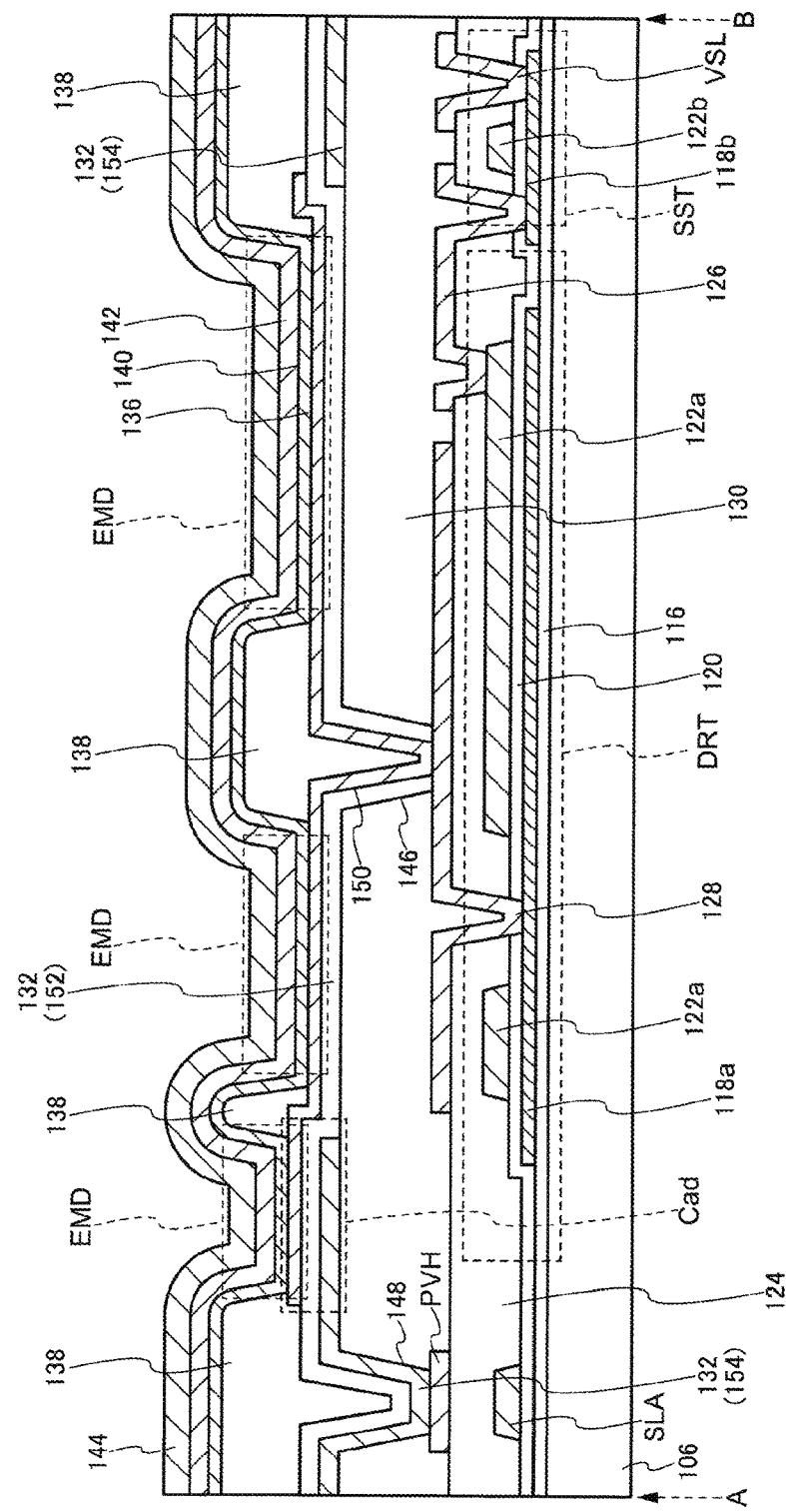
FIG. 9B is a diagram showing a cross-sectional structure of a pixel in a display device related to one embodiment of the present invention.

In the present embodiment, details of the pixel shown in the first embodiment are explained while referring to FIG. 9A and FIG. 9B. Furthermore, in the present embodiment, FIG. 9A shows a planar view of a pixel and FIG. 9B shows a cross-sectional structure along the line A-B shown in a planar view diagram. In the present embodiment, parts which are different from the third embodiment are explained and repetitive explanations of common parts are omitted.

The conducting layer 132 is arranged between the first insulating layer 130 and the second insulating layer 134. Although the conducting layer 132 is connected to the first power supply line PVH by the third contact hole 148 formed in the first insulating layer 130, the opening part 135 is arranged in a region which overlaps with the driving transistor DRT. The pixel electrode 136 is directly connected to the second wiring 128 by the first contact hole 146 formed in the first insulating layer 130 and the second contact hole 150 formed in the second insulating layer 134. The end part of the opening part 135 of the conducting layer 132 overlaps with the pixel electrode 136. As a result, the pixel electrode 136 includes a step part in plane. A periphery part of the pixel electrode 136 is covered by the third insulating layer 138. Furthermore, the third insulating layer 138 is arranged in a region which overlaps the step part formed in the pixel electrode 136. In this way, the organic layer 140 is not sufficiently covered by the step part of the pixel electrode 136, and the pixel electrode 136 and the common electrode 142 are prevented from short-circuiting.

According to the present embodiment, in the present embodiment, the conducting layer 132 is removed in the region overlapping with the first wiring 126. As a result, capacitance is not formed between the conducting layer 132 and the first wiring 126. That is, the parasitic capacitance Cp shown in FIG. 2 is not formed. On the other hand, when the conducting layer 132 is connected to the first power supply line PVH, the second capacitor element Cad is formed in a region which overlaps with the pixel electrode 136. Furthermore, the first capacitor element CS is formed in a region where the first gate electrode 122a and the second wiring 128 overlap.

As described above, according to the present embodiment, by arranging the conducting layer 132 so as to be sandwiched by insulating layers between the driving transistor DRT and the organic EL element EMD, it is possible to use the conducting layer 132 as an electrode of a capacitor element. In this case, by arranging the opening part 135 in a region where the conducting layer 132 overlaps with the first wiring 126, it is possible to prevent formation of parasitic capacitance Cp that varies the gate-source voltage of the driving transistor DRT.

What is claimed is:

1. A display device comprising:
   a switching element having a first input/output terminal electrically connected to a first signal line;
   a first wiring electrically connected to a second input/output terminal of the switching element;
   a transistor having a gate electrode electrically connected to the first wiring;
   a second wiring electrically connected to a source or drain of the transistor;
   a pixel electrode electrically connected to the second wiring;
   a first insulating layer which is arranged between the first wiring and the second wiring and is arranged between the first wiring and the pixel electrode;
   a second insulating layer arranged between the first insulating layer and pixel electrode; and
   a conducting layer arranged between the first insulating layer and the second insulating layer, the conducting layer including a region overlapping the pixel electrode; wherein
   the conducting layer further includes a dividing groove dividing the conducting layer into a plurality of regions at a region overlapping the pixel electrode.

2. The display device according to claim 1, wherein the dividing groove divides the conducting layer into a first conducting region overlapping the first wiring, and a second conducting region which is a region except the first conducting region from the conducting layer.

3. The display device according to claim 2, further comprising:
   a first capacitor element and a second capacitor element, wherein
   the first capacitor element is arranged in a region where the first conducting region of the conducting layer and the first wiring overlap, and
   the second capacitor element is arranged in a region where the second conducting region of the conducting layer and the pixel electrode overlap.

4. The display device according to claim 3, further comprising:
   a power supply line applied with a predetermined potential, and the second conducting region is electrically connected to the power supply line.

5. The display device according to claim 1, further comprising:
   a third insulating layer covering a periphery edge part of the pixel electrode.

6. The display device according to claim 1, wherein the pixel electrode includes a step part in a region overlapping the dividing groove, and the third insulating layer covers the step part.

7. The display device according to claim 6, further comprising:

an organic layer including an organic electroluminescence material arranged on an upper surface of the pixel electrode exposed from the third insulating layer, and to at least one part of the third insulating layer; and
an opposing electrode above the organic layer.

8. A display device, comprising:
a switching element having a first input/output terminal electrically connected to a first signal line;
a first wiring electrically connected to a second input/output terminal of the switching element;
a transistor having a gate electrode electrically connected to the first wiring;
a second wiring electrically connected to a source or drain of the transistor;
a pixel electrode electrically connected to the second wiring;
a first insulating layer which is arranged between the first wiring and the second wiring and is arranged between the first wiring and the pixel electrode;
a second insulating layer arranged between the first insulating layer and pixel electrode; and
a conducting layer arranged between the first insulating layer and the second insulating layer, the conducting layer including a region overlapping the pixel electrode; wherein
the conducting layer further includes an opening part in a region overlapping the first wiring.

9. The display device according to claim 8, wherein the conducting layer forms a capacitor element including the conducting layer and the pixel electrode.

10. The display device according to claim 9, further comprising:
a power supply line applied with a predetermined potential, and the conducting layer is electrically connected to the power supply line.

11. The display device according to claim 8, further comprising:
a third insulating layer covering a periphery edge part of the pixel electrode.

12. The display device according to claim 11, wherein the pixel electrode includes a step part in a region overlapping an end part of the opening part, and the third insulating layer covers the step part.

13. The display device according to claim 12, further comprising:
an organic layer including an organic electroluminescence material which is arranged on an upper surface of the pixel electrode exposed from the third insulating layer, and to at least one part of the third insulating layer; and
an opposing electrode above the organic layer.

* * * * *